(12) United States Patent
Kneissl et al.

(10) Patent No.: US 6,515,308 B1
(45) Date of Patent: Feb. 4, 2003

(54) NITRIDE-BASED VCSEL OR LIGHT EMITTING DIODE WITH P-N TUNNEL JUNCTION CURRENT INJECTION

(75) Inventors: Michael A. Kneissl, Mountain View, CA (US); Peter Kiesel, Burgthann (DE); Christian G. Van de Walle, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/024,418

(22) Filed: Dec. 21, 2001

(51) Int. Cl.$^7$ .......................... H01L 27/15; H01L 31/12
(52) U.S. Cl. .......................... 257/86; 257/104
(58) Field of Search .................. 257/79, 86, 104; 372/43

(56) References Cited

U.S. PATENT DOCUMENTS

| | | | |
|---|---|---|---|
| 5,166,761 A | 11/1992 | Olson et al. ................. | 257/46 |
| 5,219,785 A * | 6/1993 | Welch et al. ................. | 438/34 |
| 5,936,266 A | 8/1999 | Holonyak et al. ........... | 257/106 |
| 5,959,307 A * | 9/1999 | Nakamura et al. ............ | 257/14 |
| 6,054,716 A * | 4/2000 | Sonobe et al. .............. | 250/552 |
| 6,194,744 B1 * | 2/2001 | Udagawa et al. ............. | 257/94 |
| 6,365,911 B1 * | 4/2002 | Furuyama .................... | 257/25 |
| 2001/0050934 A1 * | 12/2001 | Choquette et al. ........... | 372/43 |

\* cited by examiner

*Primary Examiner*—Carl Whitehead, Jr.
*Assistant Examiner*—William C Vesperman (57) ABSTRACT

A p-n tunnel junction between a p-type semiconductor layer and a n-type semiconductor layer provides current injection for an nitride based vertical cavity surface emitting laser or light emitting diode structure. The p-n tunnel junction reduces the number of p-type semiconductor layers in the nitride based semiconductor VCSEL or LED structure which reduces the distributed loss, reduces the threshold current densities, reduces the overall series resistance and improves the structural quality of the laser by allowing higher growth temperatures.

6 Claims, 4 Drawing Sheets

NITRIDE-BASED VCSEL OR LIGHT EMITTING DIODE WITH P-N TUNNEL JUNCTION CURRENT INJECTION

CROSS-REFERENCE TO RELATED APPLICATIONS

This application contains subject matter that is related to subject matter of U.S. Patent Application Serial. No. 10/024, 417 entitled "EDGE-EMITTING NITRIDE-BASED LASER DIODE WITH P-N TUNNEL JUNCTION CURRENT INJECTION", filed concurrently with this application, commonly assigned to the same assignee herein and herein incorporated by reference.

BACKGROUND OF THE INVENTION

The present invention relates to an indium gallium aluminum nitride-based vertical cavity surface emitting laser ("VCSEL") structure or an indium gallium aluminum nitride-based light emitting diode ("LED") structure and, more particularly, to a p-n tunnel junction for current injection for the indium gallium aluminum nitride-based semiconductor VCSEL or LED structure.

Monolithic solid state semiconductor lasers are very desirable light sources for high speed laser printing, optical fiber communications and other applications. Recently, there has been an increased interest in vertical cavity surface emitting lasers although edge emitting lasers are currently used in the vast majority of applications. A common laser structure is a so-called "edge emitting laser" where light is emitted from the edge of the monolithic structure of semiconductor layers. A laser structure is a "VCSEL" where the light is emitted from the surface of the monolithic structure of semiconductor layers.

Vertical cavity surface emitting lasers are very desirable light sources for high speed laser printing, optical fiber communications, optical sampling and other applications. VCSELs have several advantages over edge emitting lasers including an emitted beam with a small angular divergence, a circular, anastigmatic beam and ease of fabrication into one or two dimensional arrays.

Vertical cavity surface emitting lasers generally consist of a planar multi-layered semiconductor structure having one or more active semiconductor layers bounded at opposite semiconductor layers that act as mirrors. The semiconductor layers on one side of the active layer in the structure are doped with impurities so as to have an excess of mobile electrons. These layers with excess electrons are said to be n-type, i.e. negative. The semiconductor layers on the other side of the active layer in the structure are doped with impurities so as to have a deficiency of mobile electrons, therefore creating an excess of positively charged carriers called holes. These layers with excess holes are said to be p-type, i.e. positive.

An electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light. Optical feedback provided by the opposite semiconductor layers allows resonance of some of the emitted light to produce coherent "lasing" through either the top surface or the bottom surface of the semiconductor laser structure.

Nitride based semiconductors, also known as group III nitride semiconductors or Group III-V semiconductors, comprise elements selected from group III, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as indium gallium aluminum nitride (InGaAlN). These materials are deposited on substrates to produce layered semiconductor structures usable as light emitters for optoelectronic device applications. Nitride based semiconductors have the wide bandgap necessary for short-wavelength visible light emission in the green to blue to violet to the ultraviolet spectrum.

These materials are particularly suited for use in short-wavelength light emitting devices for several important reasons. Specifically, the InGaAlN system has a large bandgap covering the entire visible spectrum. III-V nitrides also provide the important advantage of having a strong chemical bond which makes these materials highly stable and resistant to degradation under the high electric current and the intense light illumination conditions that are present at active regions of the devices. These materials are also resistant to dislocation formation once grown.

Semiconductor laser structures comprising nitride semiconductor layers grown on a sapphire substrate will emit light in the ultra-violet to visible spectrum within a range including 280 nm to 650 nm.

The shorter wavelength violet of nitride based semiconductor laser diodes provides a smaller spot size and a better depth of focus than the longer wavelength of red and infrared (IR) laser diodes for high-resolution or high-speed laser printing operations and high density optical storage. In addition, blue lasers can potentially be combined with existing red and green lasers to create projection displays and color film printers. The emission wavelength of GaN-based lasers and LEDs with an AlGaN or AlInGaN active region can be tuned into the UV range of the spectrum. Emission wavelength around 340 nm and 280 nm are particularly interesting for the optical excitation of biomolecules in bacteria, spores and viruses, which can be applied e.g. in bioagent detection systems.

P-type doping of InGaAlN layers is a key problem in the realization of GaN-based devices. It is difficult to achieve a high hole concentration in AlGaN alloys since the ionization energy of Mg acceptors is relatively high (~200 meV for Mg in GaN) and increases even further with higher Al content (~3 meV per % Al). Therefore, p-doped waveguide and cladding layers contribute significantly to the series resistance of the nitride-based laser structure, which results in higher operating voltages. Even in today's currently best violet nitride lasers, the operating voltages are on the order of 5 to 6 V, which is 2 to 3 V above the laser emission energy. For UV laser and LEDs, which require even higher Al compositions, the series resistance is going to be even larger. For a UV laser structure emitting around 340 nm, the required Al composition for the cladding layers would be around 30%. The increase in Mg acceptor activation energy in the AGaN layer would result in an almost an order of magnitude drop in hole concentration compared to a Mg-doped GaN film.

In addition, the optimum growth temperatures for Mg-doped AlGaN layers is typically lower than the growth temperatures for Si-doped or un-doped AlGaN films, because of the improved Mg incorporation efficiency at lower temperatures. However, the structural quality of nitride-based semiconductor layers is reduced, when grown at a lower temperature, which deteriorates the structural and electronic properties of the upper cladding layers and upper waveguide layers in a III-V nitride laser structure.

Furthermore, GaN:Mg, InGaN:Mg, short period AlGaN/GaN superlattice layers or bulk AlGaN layers doped with Mg are used as waveguiding layers in GaN-based laser diodes structures. These Mg-doped layers have a significant absorption loss particularly in the blue to ultraviolet spectrum that a nitride based laser will emit light. For laser diodes operating close to the band gap of GaN (<400 nm), this leads to increased distributed loss and consequently to increased threshold current densities.

It is an object of this invention to provide a nitride based VCSEL or LED structure with a reduced number of p-type semiconductor layers.

SUMMARY OF THE INVENTION

According to the present invention, a p-n tunnel junction between a p-type semiconductor layer and a n-type semiconductor layer provides current injection for an nitride based vertical cavity surface emitting laser or light emitting diode structure. The p-n tunnel junction reduces the number of p-type semiconductor layers in the nitride based semiconductor VCSEL or LED structure which reduces the distributed loss, reduces the threshold current densities, reduces the overall series resistance and improves the structural quality of the laser by allowing higher growth temperatures.

The relative thinness of the tunnel junction semiconductor layers allows the VCSEL or LED to emit light through the layers. The use of n-type current spreading and contact layers allows the VCSEL or LED to use a metallic annular electrode, rather than a semi-transparent electrode.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DESCRIPTION OF THE INVENTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1:
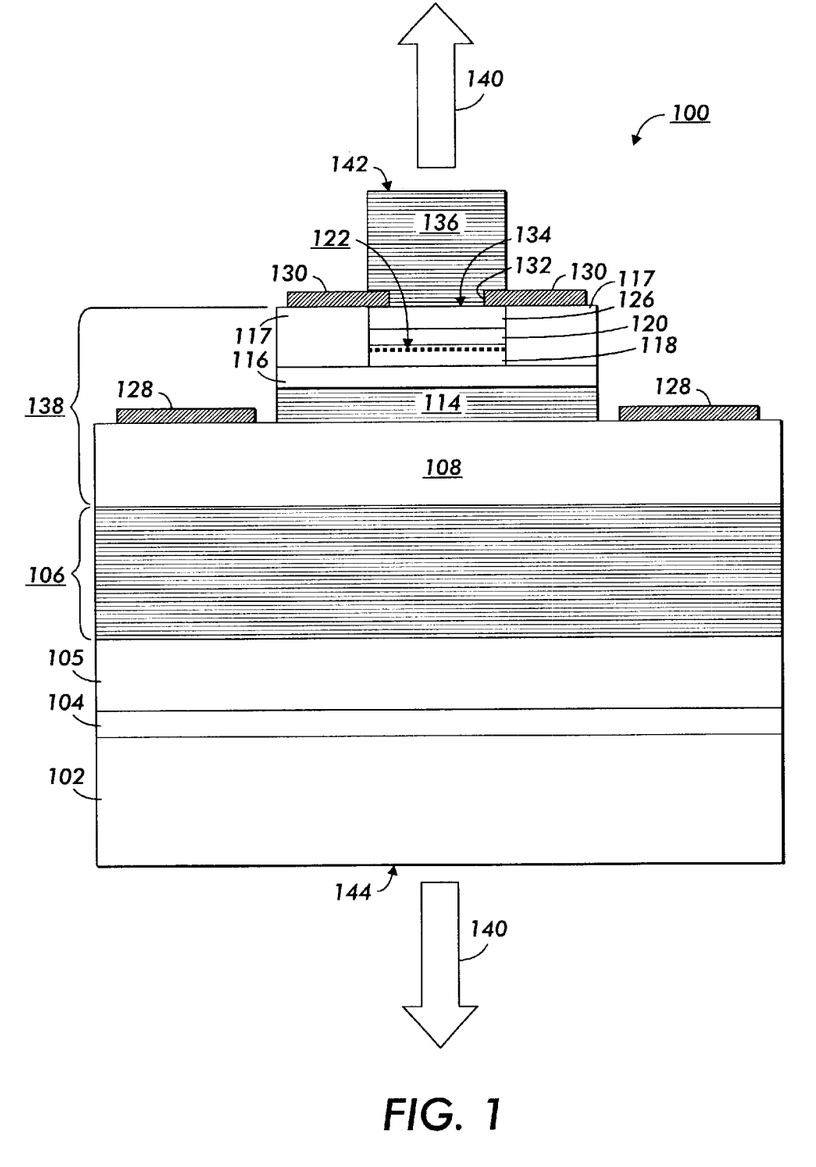
FIG. 1 is a side view of the nitride VCSEL structure with a p-n tunnel junction for current injection of the present invention.

Reference is now made to FIG. 1 wherein there is illustrated the nitride based semiconductor laser structure 100 with a p-n tunnel junction for current injection in accordance with this invention.

Figure 2:
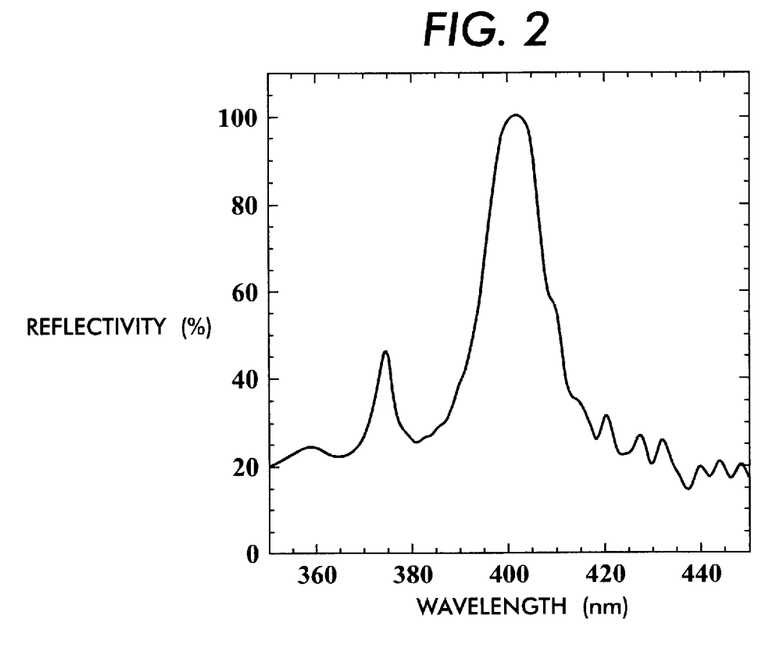
FIG. 2 is a graph of the reflectance versus wavelength for the lower DBR of the nitride VCSEL structure with a p-n tunnel junction of FIG. 1.

The nitride based semiconductor VCSEL structure 100 of FIG. 2 has a C-face (0001) or A-face (11$\bar{2}$0) oriented sapphire ($Al_2O_3$) substrate 102 on which is epitaxially deposited a succession of semiconductor layers. The sapphire substrate 102 typically has a thickness of 200 micron to 1000 micron. The sapphire substrate is an illustrative example, other possible substrates for the laser structure 100 of the present invention include silicon carbide (SiC), spinel ($MgAl_2O_4$), aluminum nitride (AlN) or gallium nitride (GaN).

The laser structure 100 includes an n-type nucleation layer 104 formed on the sapphire substrate 102. Typically, the nucleation layer 104 is a binary or ternary III-V nitride material, such as, for example, GaN, AlN, InGaN or AlGaN. The nucleation layer 104 in this illustrative example is undoped GaN and has typically a thickness in the range between 10 nm and 30 nm.

A III-V nitride buffer layer 105 is formed on the nucleation layer 104. The buffer layer 105 is an n-type GaN or AlGaN layer. The buffer layer 105 establishes good structural quality III-V nitride film and may also act as a lateral n-contact and current spreading layer. The buffer layer 105 typically has a thickness of from about 1 $\mu$m to about 20 $\mu$m. The buffer layer 105 is typically n-type GaN:Si or AlGaN:Si.

In the case when substrates like GaN or AlN are used, a nucleation layer is not required and the buffer layer then acts as a transition layer between the GaN or AlN substrate and the AlGaN/GaN-DBR mirrors. The transition layer can also be a graded $Al_xGa_{1-x}N$ layer with its Al composition x graded between the substrate and the DBR mirrors. A lower distributed Bragg reflector 106 is formed on the buffer layer 104. The distributed Bragg reflector ("DBR") 106 contains 20 to 100 pairs of alternating GaN and AlGaN layers of a quarter-wavelength thickness. The mirror layers can be either un-doped or n-type GaN:Si and AlGaN:Si. If the emission wavelength of the VCSEL is in the UV (above the bandgap of GaN) the mirror pairs can also be composed of quarter-wavelength thick $Al_xGa_{1-x}N$ and $Al_yGa_{1-y}N$ layers where 1>=y>x>0. FIG. 2 shows an example of the reflection spectra of a 60 pair $GaN/Al_{0.25}Ga_{0.75}N$-DBR mirror grown on sapphire substrate before the growth of the active region.

A III-V nitride lateral n-contact and waveguide layer 108 is formed on the lower DBR 106. The III-V nitride layer 108 is an n-type GaN:Si layer acting as a lateral n-contact and current spreading layer. The contact and current spreading layer 108 typically has a thickness of from about 50 nm to about 1 $\mu$m. The III-V nitride layer 108 can alternately be n-type AlGaN:Si. The waveguide layer 108 can also be GaN:un, InGaN:un or InGaN:Si with an indium content smaller than the InAlGaN quantum well in the active region 114.

On top of the waveguide and lateral n-contact layer 108, the III-V nitride quantum well active region 114 is formed.

The quantum well active region 114 is comprised of at least one $In_xAl_yGa_{1-x-y}N$ quantum well (1>=x>=0, 1>=y>=0, 1>=x+y>=0). For multiple-quantum well active regions, the individual quantum wells typically have a thickness of from about 10 Å to about 100 Å and are separated by InGaN, AlGaN, InAlGaN or GaN barrier layers which have typically a thickness of from about 10 Å to about 200 Å. The InAlGaN quantum wells and the InAlGaN barrier layers are typically undoped or can be Si-doped.

A III-V nitride electron blocking layer 116 is formed over the quantum well active region 114. The p-type AlGaN:Mg electron blocking layer 116 serves as electron blocking layer and carrier confinement layer to keep electrons from leaking out of the active region 114. The acceptor concentration of the AlGaN electron blocking layer 116 is in the range between $1*10^{18}$ cm$^{-3}$ and $2*10^{20}$ cm$^{-3}$ and typically around $1*10^{20}$ cm$^{-3}$.

Figure 3:
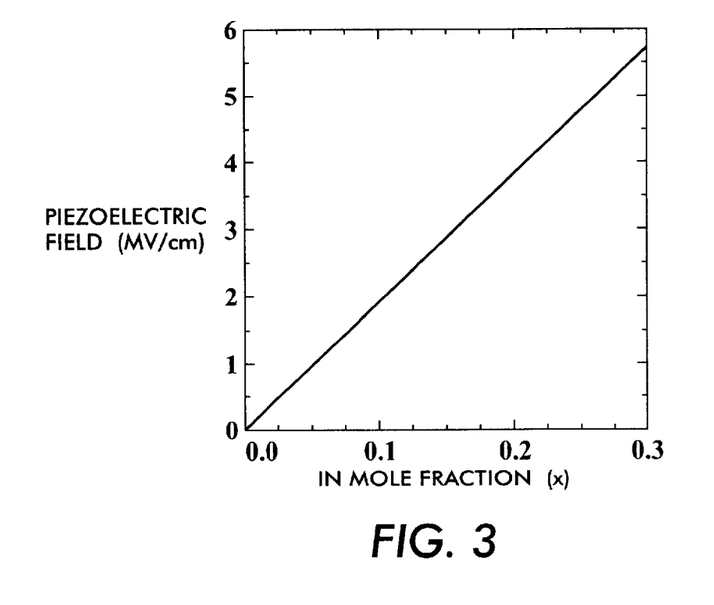
FIG. 3 is a graph of the strength of the piezo-electric field versus the indium content in InGaN layers in the nitride VCSEL structure with a p-n tunnel junction of FIG. 1.

The first part of the tunnel junction layer 118 is formed over the electron blocking layer 116. The highly p-type doped GaN:Mg layer 118 serves also as part of the waveguide layer and has a thickness between 10 nm and 100 nm and typically around 20 nm. The acceptor concentration of the GaN layer 118 is in the range between $1*10^{19}$ cm$^{-3}$ and $2*10^{20}$ cm$^{-3}$ and typically around approximately $1*10^{20}$ cm$^{-3}$. Alternatively the first part of the tunnel junction can be formed from highly p-type doped InGaN:Mg or InGaAlN:Mg. The tunnel probability increases exponentially with decreasing tunnel junction bandgap [$\sim\exp(-E_{gap}^{1.5})$] and therefore the lower bandgap $E_{gap}$ of the InGaN layer would reduce the operating voltage. In addition, the large polarization fields present in pseudomorphicaly strained InGaN films would add to the built-in field of the pn-junction and consequently increase the total electric field across the tunnel junction. As the tunnel probability increases exponentially with increasing tunnel junction field F [$\sim\exp(-1/F)$], the larger total electric field across the tunnel junction would reduce the operating voltage. A calculated curve showing the strength of the piezo-electric field in InGaN films vs. the In composition is shown in FIG. 3. As can be seen, even at moderate In content of 10% the piezoelectric field in the layer is on the order of 2 MV/cm.

The second part of the tunnel junction layer 120 is formed over the first part of the tunnel junction layer 118. The highly n-type doped GaN:Si layer 120 serves also as part of the waveguide layer and has a thickness between 10 nm and 100 nm and typically around 20 nm. The n-doping level of the GaN layer 120 is in the range between $5*10^{18}$ cm$^{-3}$ and $1*10^{20}$ cm$^{-3}$ and typically around $5*10^{19}$ cm$^{-1}$. Alternatively the second part of the tunnel junction can be formed from highly n-type doped InGaN:Si or InGaAlN:Si. The tunnel probability increases exponentially with decreasing tunnel junction bandgap and increasing tunnel junction field F and therefore the lower bandgap $E_{gap}$ and the polarization field of the InGaN layer would reduce the operating voltage.

Alternatively, the second part of the tunnel junction can be formed from highly n-type doped oxides such as ZnO, CdO, MgO, SnO$_2$ or In$_2$O$_3$. N-doping in these films is achieved with Al, Ga, In, F, Sn or Si with doping levels ranging between $1*10^{19}$ cm$^{-3}$ and $1*10^{21}$ cm$^{-3}$ and typically around $1*10^{20}$ cm$^{-1}$. ZnO, SnO$_2$ or In$_2$O$_3$ can be deposited by RF magnetron sputtering, pulsed laser deposition or MOCVD. Compounds of these oxides could also be used, e.g. Cd$_2$SnO$_4$. The advantage of using an oxide such as ZnO lies in the fact that the band offsets between ZnO and GaN are large, with both the valence band and conduction band of ZnO lying significantly lower in energy than the corresponding bands in GaN. This band alignment facilitates tunneling from the oxide conduction band into the nitride valence band. In addition, ZnO or other oxides with band gap exceeding that of the InAlGaN active layer are transparent to the light emitted from the active layer, hence optical absorption losses are small.

The tunnel junction 122 of the present invention is the interface between the p-(In)GaN:Mg layer 118 and the n-(In)GaN:Si layer 120 (or n-type ZnO, SnO$_2$, In$_2$O$_3$ layer). In order to avoid Mg p-dopant memory effects and to obtain a sharp p-n interface at the tunnel junction 122, a growth stop of typically 60 seconds to 600 seconds is introduced between deposition of the highly p- and n-doped layers 118 and 120. Alternatively, the sample can be taken out of the reactor and the surface can be etched (e.g. dry-etching) in order to remove any possible Mg accumulating at the surface.

A III-V nitride contact layer 126 is formed over the cladding layer 124. The n-type GaN:Si layer 126 forms a n-contact layer for the minimum-resistance metal electrode 130 to contact the p-side of the laser heterostructure 100. It also serves as a current spreading layer and the final portion of the waveguide layer. The contact layer can be also formed from InGaN:Si or n-type ZnO, SnO$_2$ or In$_2$O$_3$. The contact layer 126 typically has a thickness of from about 10 nm to 1 μm.

The laser structure 100 can be fabricated by a technique such as metalorganic chemical vapor deposition (MOCVD) or molecular beam epitaxy as is well known in the art.

Dry-etching using CAIBE (chemical assisted ion beam etching) or RIE (reactive ion beam etching) in an Ar/Cl$_2$/BCl$_3$ gas mixture is used to etch a portion of the VCSEL structure 100 down to the GaN:Si contact and current-spreading layer 108.

An n-type Ti/Al electrode 128 is formed on the etched, exposed n-current-spreading layer 108 of the VCSEL structure 100, which is functioning as a lateral contact layer.

Dry-etching using CAIBE (chemical assisted ion beam etching) or RIE (reactive ion beam etching) in an Ar/Cl$_2$/BCl$_3$ gas mixture is used to etch a second (narrower) portion of the VCSEL structure 100 down to the AlGaN:Mg electron blocking layer 116. A silicon dioxide ring 117 is formed on top of that second etched portion down to the electron blocking layer 116, surrounding tunnel junction layers 118, 120 and contact layer 126. The silicon dioxide ring 117 serves as a current blocking layer in order to isolate the top p-side electrode from the underlying structure and also to provide lateral optical confinement. The silicon dioxide ring can be deposited by e-beam evaporation, sputtering or chemical vapor deposition (CVD).

A n-type Ti/Al/Ti/Au electrode 130 used as the p-side electrode is formed on the p-side contact layer 126 and the silicon dioxide ring 117 of the VCSEL structure 100. The electrode 130 is annular with an open circular aperture 132 on the surface 134 of the contact layer 126.

An upper distributed Bragg reflector 136 is formed in the open circular aperture 132 of the electrode 130 on the surface 134 of the contact layer 126. The distributed Bragg reflector ("DBR") 136 consists of 6 to 20 pairs of alternating SiO$_2$ and Ta$_2$O$_5$ layers of a quarter-wavelength thickness. Typically 12 pairs of alternating SiO$_2$ and Ta$_2$O$_5$ layers of a quarter-wavelength thickness are used. The silicon dioxide and tantalum pentoxide layers can be deposited by e-beam evaporation, sputtering or chemical vapor deposition (CVD). Alternatively to Ta$_2$O$_5$ other materials like HfO$_2$, TiO$_2$ or Al$_2$O$_3$ can be used.

The laser cavity 138 of the VCSEL structure 100 is between the lower DBR 106 30 and the upper DBR 136 and consists of n-contact and current spreading layer 108, n-cladding layer 110, n-waveguide layer 112, quantum well active region 114, p-type AlGaN:Mg electron blocking layer 116, p-waveguide layer 118 and n-waveguide layer 120 forming the tunnel junction 122, n-cladding layer 124 and n-contact layer 126.

The III-V nitride layers can be doped p-type or n-type by conventional processes. Examples of p-type dopants include, but are not limited to, Mg, Ca, C and Be. Examples of n-type dopants include, but are not limited to, Si, O, Se, and Te.

Current flowing between the electrodes 130 and 128 causes the nitride based semiconductor VCSEL structure 100 to emit a light beam 140 from the active region 114 of the laser cavity 138 through the surface 142 of the upper DBR 136.

The p-n tunnel junction 122 provides current injection from the p-side of the laser to structure. The very high doping levels of p and n conductivity types on opposite sides of the tunnel junction 122 between the waveguide layers 118 and 120 (and the in case of a InGaN tunnel junction piezoelectric fields) cause a sufficient amount of carriers to tunnel from the conduction band of layer 120 into the valence band of layer 118. The voltage applied between the electrodes 130 and 128 reverse biases the tunnel junction 122 and the current flows across the junction by quantum mechanical tunneling with a relative small voltage drop.

The voltage drop across the tunnel junction 122 depends on the doping levels in the layers 118 and 120 bounding the junction, on the band gap of the materials of these layers, and on the band offsets between these layers in the case of a heterojunction. Using as high a doping level as possible in the layers 118 and 120 minimizes the voltage drop across the tunnel junction. The voltage drop across the tunnel junction is further reduced by the piezoelectric fields if InGaN layers are use in the tunnel junction.

The p-side electrode 130 can be a semi-transparent electrode layer covering the entire aperture of the VCSEL p-contact layer The semi-transparent electrode would be ITO (indium-tin-oxide), CTO (cadmium-tin-oxide), ZnO, $SnO_2$ or $In_2O_3$.

Alternately, the upper DBR 136 can be pairs of alternating GaN and AlGaN layers of a quarter-wavelength thickness. The upper GaN/AlGaN-DBR can be un-doped or n-doped with e.g. Si. There would be fewer GaN/AlGaN pairs in the upper DBR 136 than in the lower DBR 106 for a lower reflectance from the upper DBR and thus light beam emission from the surface of the upper DBR.

The active region 114 of the laser cavity 138 can also emit light through the surface 144 of the sapphire substrate 102 if the lower DBR 106 is less reflective than the upper DBR 136. Sapphire is transparent to the wavelength of light from the nitride-based VCSEL 100.

The tunnel junction concept could be also applied to light emitting diode structures. In conventional InGaN multiple quantum well LED devices, a semi-transparent upper electrode is used for the p-contact to improve current spreading in the highly resistive p-semiconductor layers. Part of the emitted light, however, is absorbed in the semi-transparent contact. The much higher electric conductivity of n-layer (by replacing the p-layers with a p-n tunnel junction and n-layers) would lead to a much more uniform current spreading and make the use of a semi-transparent top-electrode possible in the present invention.

Figure 4:
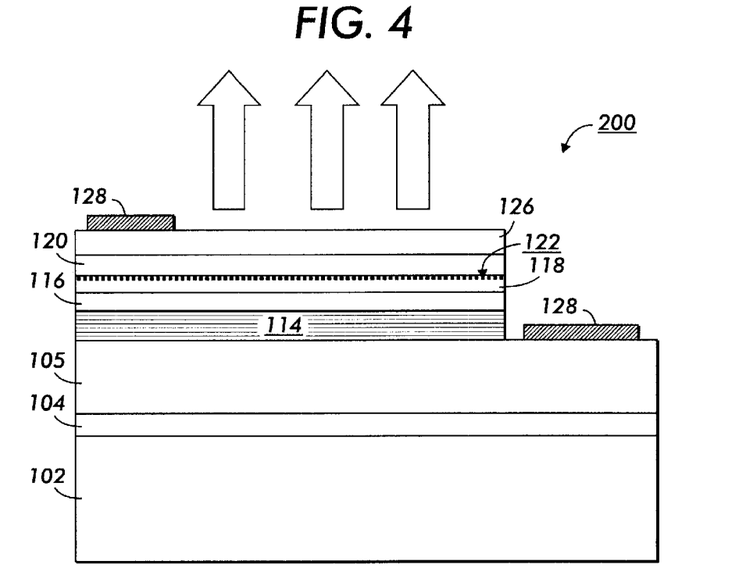
FIG. 4 is a side view of the nitride based semiconductor light emitting diode (LED) structure with a p-n tunnel junction for current injection of the present invention.

Reference is now made to FIG. 4 wherein there is illustrated the nitride based semiconductor light emitting diode (LED) structure 200 with a p-n tunnel junction 122 for current injection in accordance with this invention.

The nitride based semiconductor LED structure 200 of FIG. 4 has a C-face (0001) or A-face (11$\underline{2}$0) oriented sapphire ($Al_2O_3$) substrate 102 on which is epitaxially deposited a succession of semiconductor layers. The sapphire substrate 102 typically has a thickness of 200 micron to 1000 micron. The sapphire substrate is an illustrative example, other possible substrates for the LED structure 100 of the present invention include silicon carbide (SiC), spinel ($MgAl_2O_4$), aluminum nitride (AlN) or gallium nitride (GaN).

The LED structure 200 includes an n-type nucleation layer 104 formed on the sapphire substrate 102. Typically, the nucleation layer 104 is a binary or ternary III-V nitride material, such as, for example, GaN, AlN, InGaN or AlGaN. The nucleation layer 104 in this illustrative example is undoped GaN and has typically a thickness in the range between 10 nm and 30 nm.

A III-V nitride buffer and n-contact layer 105 is formed on the nucleation layer 104. The buffer layer 105 is an n-type GaN or AlGaN layer. The buffer layer 105 establishes good structural quality III-V nitride film and may also act as a lateral n-contact and current spreading layer. The buffer layer 105 typically has a thickness of from about 1 $\mu$m to about 20 $\mu$m. The buffer layer 105 is typically n-type GaN:Si or AlGaN:Si.

In the case when substrates like GaN or AlN are used, a nucleation layer is not required and the buffer layer then acts as a transition layer between the GaN or AlN substrate and the InGaN MQW active region. The transition layer can also be a graded $Al_xGa_{1-x}N$ layer with its Al composition x graded between the substrate and the InGaN MQW active region.

On top of the buffer and n-contact layer 105, the III-V nitride quantum well active region 114 is formed. The quantum well active region 114 is comprised of at least one $In_xAl_yGa_{1-x-y}N$ quantum well (1>=x>=0, 1>=y>=0, 1>=x+y>=0). For multiple-quantum well active regions, the individual quantum wells typically have a thickness of from about 10 Å to about 100 Å and are separated by InGaN, AlGaN, InAlGaN or GaN barrier layers which have typically a thickness of from about 10 Å to about 200 Å. The InAlGaN quantum wells and the InAlGaN barrier layers are typically undoped or can be Si-doped.

A III-V nitride electron blocking layer 116 is formed over the quantum well active region 114. The p-type AlGaN:Mg electron blocking layer 116 serves as electron blocking layer and carrier confinement layer to keep electrons from leaking out of the active region 114. The p-doping level of the AlGaN electron blocking layer 116 is in the range between $1*10^{18}$ cm$^{-3}$ and $2*10^{20}$ cm$^{-3}$ and typically around $1*10^{20}$ cm$^{-3}$.

The first part of the tunnel junction layer 118 is formed over the electron blocking layer 116. The highly p-type doped GaN:Mg layer 118 serves also as part of the waveguide layer and has a thickness between 10 nm and 100 nm and typically around 20 nm. The p-doping level of the GaN layer 118 is in the range between $1*10^{19}$ cm$^{-3}$ and $2*10^{20}$ cm$^{-3}$ and typically around approximately $1*10^{20}$ cm$^{-3}$. Alternatively the first part of the tunnel junction can be formed from highly p-type doped InGaN:Mg or InGaIN:Mg.

The second part of the tunnel junction layer 120 is formed over the first part of the tunnel junction layer 118. The highly n-type doped GaN:Si layer 120 has a thickness between 10 nm and 100 nm and typically around 20 nm. The n-doping level of the GaN layer 120 is in the range between $5*10^{18}$ cm$^{-3}$ and $1*10^{20}$ cm$^{-3}$ and typically around $5*10^{19}$ cm$^{-1}$. Alternatively the second part of the tunnel junction can be formed from highly n-type doped InGaN:Si or InGaAlN:Si.

Alternatively, the second part of the tunnel junction can be formed from highly n-type doped oxides ZnO, CdO, SnO$_2$ or In$_2$O$_3$. N-doping in these films is achieved with Al, Ga, In, F, Sn or Si with doping levels ranging between $1*10^{19}$ cm$^{-3}$ and $1*10^{21}$ cm$^{-3}$ and typically around $1*10^{20}$ cm$^{-1}$. ZnO, CdO, SnO$_2$ or In$_2$O$_3$ can be deposited by RF magnetron sputtering, pulsed laser deposition or MOCVD. Compounds of these oxides could also be used, e.g. Cd$_2$SnO$_4$. The tunnel junction 122 of the present invention is the interface between the p-(In)GaN:Mg layer 118 and the n-(In)GaN:Si layer 120 (or n-type ZnO, CdO, SnO$_2$,In$_2$O$_3$ layer).

A III-V nitride contact layer 126 is formed over the second portion of the tunnel junction layer 120. The n-type GaN:Si layer 126 forms a n-contact layer for the minimum-resistance metal electrode to contact the p-side of the LED heterostructure 100. It also serves as a current spreading layer. The contact layer can be also formed from InGaN:Si or n-type ZnO, CdO, SnO$_2$ or In$_2$O$_3$. The contact layer 126 typically has a thickness of from about 10 nm to 1 $\mu$m.

The LED structure 200 can be fabricated by a technique such as metalorganic chemical vapor deposition (MOCVD) or molecular beam epitaxy as is well known in the art.

Dry-etching using CAIBE (chemical assisted ion beam etching) or RIE (reactive ion beam etching) in an Ar/Cl$_2$/BCl$_3$ gas mixture is used to etch a portion of the LED structure 200 down to the GaN:Si contact and buffer layer 105.

An n-type Ti/Al electrode 128 is formed on the etched, exposed n-current-spreading layer 105 of the LED structure 200, which is functioning as a lateral contact layer. A n-type Ti/Al/Ti/Au electrode 130 used as the p-side electrode is formed on the p-side contact layer 126 of the LED structure 200.

Current flowing between the electrodes 130 and 128 causes the nitride based semiconductor LED structure 200 to emit a light beam 140 from the active region 114 of the LED through the surface of the current spreading layer and through the substrate of the lower DBR 106.

Figure 5:
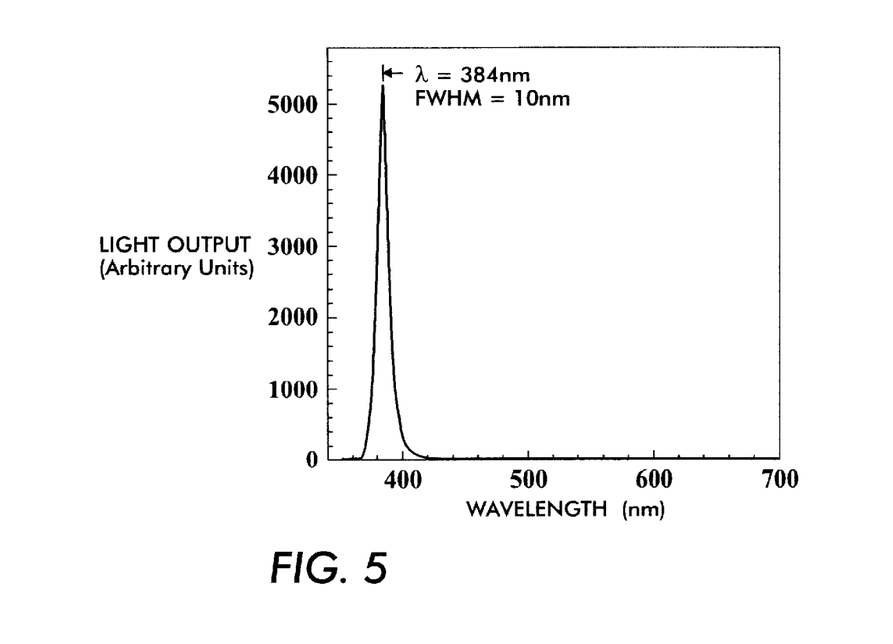
FIG. 5 is a graph of the emission spectra of the nitride based semiconductor light emitting diode (LED) structure with a p-n tunnel junction of FIG. 4.
Figure 6:
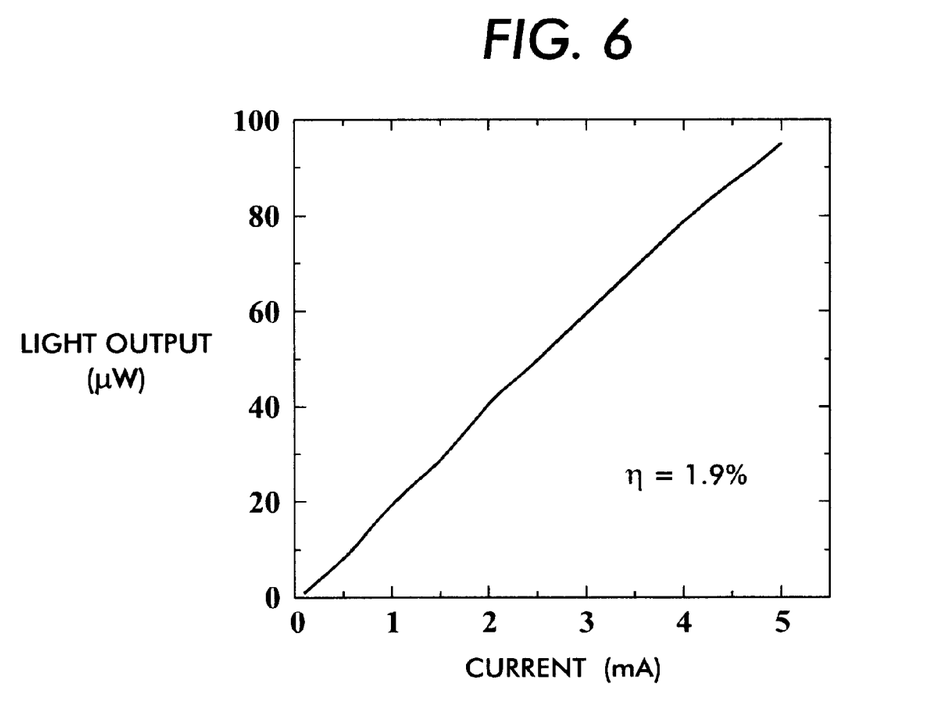
FIG. 6 is a graph of the light output vs. current characteristic of the nitride based semiconductor light emitting diode (LED) structure with a p-n tunnel junction of FIG. 4.

FIG. 5 shows the emission spectra of such a tunnel junction LED. The light output vs. current characteristic of the same LED is shown in FIG. 6. In summary, this invention proposes a nitride based semiconductor laser 100 and LED structure 200 with a p-n tunnel junction 122 for current injection from the p-side of the structure.

The absorption or distributed optical loss in the nitride based semiconductor VCSEL structure 100 and therefore the threshold current densities for the nitride based semiconductor VCSEL structure 100 are reduced by eliminating almost all p-doped layers from the device structure (i.e. the upper p-GaN:Mg waveguide layer and the upper p-GaN:Mg contact layer). The reduction in optical loss by using a p-n tunnel junction 122 for current injection is particularly useful for nitride based semiconductor VCSELs which emit light in the near UV and UV spectrum. The reduction in threshold current densities by using a p-n tunnel junction 122 for current injection is particularly useful for nitride based semiconductor lasers which have high current densities relative to laser structures fabricated from arsenides and other semiconductor materials.

Replacing the p-doped semiconductor layers with more conductive n-doped semiconductor layers in the nitride based semiconductor laser structure 100 with a p-n tunnel junction 122 for current injection reduces the overall series resistance of the laser structure, since most of the excess voltage drop is across the p-layers and p-contact. Although the additional voltage required for current injection through the p-n tunnel junction will offset this benefit somewhat, the net operating voltage of the nitride based semiconductor laser structure should not increase if the tunnel junction is properly designed with thin layers and high doping concentrations.

Furthermore the structural quality of the upper cladding and waveguide layers could be improved, because eliminating p-doping makes higher growth temperatures and better growth control possible, which is preferable for high quality GaN layers.

Doping concentrations in adjacent semiconductor layers that are high enough to constitute a tunnel junction give rise to strong light absorption in the doped material. This presents a problem for a VCSEL where emitted light must pass through the tunnel junction layers. In spite of the large power drop which could result from light passing through semiconductor layers doped in this way, the relative thinness of the tunnel junction layers 118 and 120 in the present invention 100 limits the overall absorption of light to avoid significantly disturbing the establishment of appropriate light oscillation in the laser cavity 138.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor laser structure comprising:

a substrate;

a plurality of III-V nitride semiconductor layers formed on said sapphire substrate, at least one of said plurality of III-V nitride semiconductor layers forms an active region;

a first semiconductor layer being p-type III-V nitride semiconductor, a second semiconductor layer formed on said first semiconductor layer, said a second semiconductor layer being n-type oxide semiconductor, tunnel junction means disposed between said first semiconductor layer and said second semiconductor layer for injecting current into said active region; and wherein a sufficient forward bias is applied to said active region to cause lasing from a surface of said semiconductor laser structure.

2. The semiconductor laser structure of claim 1 wherein one of said plurality of III-V nitride semiconductor layers is an electron blocking layer formed on said active region, said electron blocking layer being p-type III-V nitride semiconductor layer, and said first semiconductor layer is formed on said electron blocking layer.

3. The semiconductor laser structure of claim 1 further comprising a first distributed Bragg reflector between said substrate and said active region, a second distributed Bragg reflector formed on said plurality of III-V nitride semiconductor layers, said lasing being from a surface of said second distributed Bragg reflector.

4. A semiconductor light emitting diode structure comprising:

a substrate;

a plurality of III-V nitride semiconductor layers formed on said sapphire substrates at least one of said plurality of III-V nitride semiconductor layers forms an active region;

a fist semiconductor layer being p-type III-V nitride semiconductor, a second semiconductor layer formed on said first semiconductor layer, said a second semiconductor layer being n-type oxide semiconductor, tunnel junction means disposed between said first semiconductor layer and said second semiconductor layer for injecting current into said active region; and wherein a sufficient forward bias is applied to said active region to cause light emission from a surface of said semiconductor light emitting diode structure.

5. The semiconductor light emitting diode structure of claim 4 wherein one of said plurality of III-V nitride semiconductor layers is an electron blocking layer formed on said active region, said electron blocking layer being p-type III-V nitride semiconductor layer, and said first semiconductor layer is formed on said electron blocking layer.

6. The semiconductor light emitting diode structure of claim 4 further comprising a first distributed Bragg reflector between said substrate and said active region.

* * * * *